(12) United States Patent
Choi et al.

(10) Patent No.: US 10,234,740 B2
(45) Date of Patent: Mar. 19, 2019

(54) LIQUID CRYSTAL DISPLAY DEVICE

(71) Applicant: LG Display Co., Ltd., Seoul (KR)

(72) Inventors: IIMan Choi, Gyeongsangbuk-do (KR); Jin Kim, Incheon (KR); Hojin Jung, Daejeon (KR); Sangpil Yoon, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 146 days.

(21) Appl. No.: 15/381,333

(22) Filed: Dec. 16, 2016

(65) Prior Publication Data

US 2017/0176793 A1 Jun. 22, 2017

(30) Foreign Application Priority Data

Dec. 18, 2015 (KR) ........................ 10-2015-0182291

(51) Int. Cl.
*H01L 27/12* (2006.01)
*G02F 1/1368* (2006.01)
*G02F 1/1343* (2006.01)
*G02F 1/1362* (2006.01)
*H01L 29/417* (2006.01)
(Continued)

(52) U.S. Cl.
CPC ...... *G02F 1/1368* (2013.01); *G02F 1/134336* (2013.01); *G02F 1/136286* (2013.01); *H01L 27/124* (2013.01); *H01L 27/1296* (2013.01); *H01L 29/41733* (2013.01); *H01L 29/41775* (2013.01); *H01L 29/78696* (2013.01); *G02F 2001/13606* (2013.01); *G02F 2001/134345* (2013.01); *G02F 2201/122* (2013.01); *G02F 2201/123* (2013.01); *G02F 2201/40* (2013.01)

(58) Field of Classification Search
CPC ... H01L 29/41; H01L 29/417; H01L 29/4173; H01L 29/4177; H01L 29/41733; H01L 29/71775; H01L 27/12; H01L 27/124; H01L 27/129; H01L 27/1296
USPC .......................................................... 257/71
See application file for complete search history.

(56) References Cited

U.S. PATENT DOCUMENTS

2008/0225195 A1 9/2008 Oohara et al.
2010/0259699 A1 10/2010 Yen et al.
(Continued)

OTHER PUBLICATIONS

Extended European Search Report dated May 4, 2017 for the counterpart European patent application No. 16204753.4-1914.

*Primary Examiner* — Monica D Harrison
(74) *Attorney, Agent, or Firm* — Morgan, Lewis & Bockius LLP

(57) ABSTRACT

A display device comprises a substrate having a display area, first and second gate lines extending in a first direction in the display area, first and second data lines extending in the display area in a second direction intersecting the first direction, and a pixel defined by the first and second gate lines and the first and second data lines, and having a thin-film transistor and a pixel electrode. The thin-film transistor comprises a gate electrode connected to the second gate line, a source electrode connected to the first data line, and a drain electrode spaced apart from the first source electrode. The drain electrode includes a first end portion extending in the second direction and overlapping with the gate electrode in plan view, and a second end portion electrically connected to the first end portion and to the pixel electrode.

23 Claims, 6 Drawing Sheets

(51) Int. Cl.
 *H01L 29/786* (2006.01)
 *G02F 1/136* (2006.01)

(56) References Cited

U.S. PATENT DOCUMENTS

2013/0242218 A1   9/2013  Hou et al.
2016/0155393 A1*  6/2016  Jung .................... G09G 3/3607
                                                                345/89

* cited by examiner

LIQUID CRYSTAL DISPLAY DEVICE

CROSS-REFERENCE TO RELATED APPLICATIONS

This application claims the benefit of Korean Patent Application No. 2015-0182291 filed on Dec. 18, 2015, in the Korean Intellectual Property Office, which is hereby incorporated by reference for all purposes as if fully set forth herein.

BACKGROUND

Technical Field

The present disclosure relates to a liquid-crystal display (LCD) device, and more specifically to an LCD device capable of reducing deviations in capacitance among cells due to a manufacturing process error.

Description of the Related Art

At present, a liquid-crystal display (LCD) device is one of the most prevalent display devices. An LCD device may include a plurality of gate lines and a plurality of data lines intersecting one another, and a plurality of pixels each defined by the respective gate lines and data lines.

Each of the pixels in an LCD device may include a pixel electrode, a common electrode and a thin-film transistor working as a switching element. The thin-film transistor may receive a data voltage supplied via a data line and supply it to the pixel electrode of the pixel in response to a scan signal supplied via a gate line. Accordingly, the gate electrode of the thin-film transistor is electrically connected to the gate line, the source electrode is electrically connected to the data line, and the drain electrode is electrically connected to the pixel electrode.

In such an LCD device, liquid-crystal molecules are tilted by a difference in potential between a pixel electrode receiving a data voltage from a thin-film transistor and a common electrode receiving a common voltage. The amount of transmitted light varies depending on the angle at which the liquid-crystal molecules are tilted, and thus images are displayed as a result thereof.

Since LCD devices display images by using such electrochemical characteristics of liquid-crystal molecules, if voltages of the same polarity are applied continuously to the pixels through prolonged use, the liquid-crystal molecules become less sensitive over time to an applied voltage, resulting in a slower response speed. Accordingly, problems such as afterimage effects may arise, resulting in a decline in the quality of images.

To overcome the above problem of liquid-crystal molecules deterioration, an alternative approach has been proposed in which data voltages of opposite polarities are alternately applied to the pixels. According to this approach, a data signal of one polarity is applied to pixels in a row. Then, the polarity is inverted with a polarity control signal (POL) so that a data signal of the opposite polarity is applied to the pixel in the next row. In addition to such an alternative approach, there have been attempts to suppress liquid-crystal molecules from deteriorating by way of developing new structures.

For example, in an LCD device where data voltages of opposite polarities are alternately applied to pixels to suppress liquid-crystal molecules from deteriorating, to reduce power consumption, and to increase image quality, a proposal has been made to dispose thin-film transistors on one side of pixels in a row and the other side of pixels in the next row, i.e., in a zigzag pattern. Specifically, thin-film transistors may be disposed on the left side of pixels in odd rows, whereas thin-film transistors may be disposed on the right side of pixels in the even rows. That is, channel regions in the odd row pixels are disposed on the left side of respective data lines, whereas channel regions in the even row pixels are disposed on the right side of the respective data lines. Accordingly, the drain electrode of a thin-film transistor in an odd row pixel is disposed on the left side of the source electrode of the thin-film transistor, whereas the drain electrode of a thin-film transistor in an even row pixel is disposed on the right side of the source electrode of the thin-film transistor.

Incidentally, parasitic capacitance Cgd is formed in the area where the drain electrode overlaps with the gate electrode of a thin-film transistor. Therefore, in an ideal LCD device where thin-film transistors in pixels are arranged in a zigzag pattern across rows, the area where the drain electrode overlaps with the gate electrode of a thin-film transistor in each of pixels in the odd rows is equal to that of each of pixels in the even rows. When parasitic capacitance is generated between the gate electrode and the drain electrode of a thin-film transistor, a gate signal is delayed. The greater the difference in parasitic capacitance between pixels, the greater the difference in timing of a gate signal applied to one pixel and that applied to another pixel. Accordingly, the magnitude of data voltage charged in one pixel may become significantly different from that of another pixel such that image quality declines. This is why it is preferable that the area where the drain electrode overlaps with the gate electrode of a thin-film transistor in each of the pixels in odd rows is equal to or nearly equal to that of each of the pixels in even rows.

In an LCD device where thin-film transistors in pixels are arranged in a zigzag pattern across rows, if the location of a drain electrode is shifted due to a manufacturing process error, e.g., misalignment of masks used for forming electrodes of the thin-film transistors, the area where the drain electrode overlaps with the gate electrode of a thin-film transistor in each of the pixels in odd rows may become significantly different from that of each of the pixels in even rows. As a result, the difference in parasitic capacitance between the pixels in the odd rows and the pixels in the even rows may become more significant.

As such, if the parasitic capacitance in the pixels in one row becomes significantly different from that of the pixels in the next row, the data voltages charged in the pixels become significantly different between two adjacent rows. Thus, the image quality of the LCD device may decline due to undesirable phenomena such as flickers and vertical lines.

SUMMARY

Accordingly, the present invention is directed to a display device that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a display device comprises: a substrate having a display area; a plurality of gate lines extending in a first direction in the display area, the gate lines including a first gate line and a second gate line; a plurality of data lines extending in the display area in a second direction intersecting the first direction, the data lines including a first data line and a second data line; and a first pixel having a first thin-film transistor and a first pixel electrode, and defined by the first gate line, the second gate line, the first data line, and the second data line, wherein the first thin-film transistor comprises a first gate electrode connected to the second gate line, a first source electrode connected to the first data line, and a first drain electrode spaced apart from the first source electrode, the first drain electrode including a first end portion extending in the second direction and overlapping with the first gate electrode in terms of their planar configuration, and a second end portion electrically connected to the first end portion and to the first pixel electrode.

The above display device may further incorporate one or more of the following additional features:

An overlap area between the first end portion of the first drain electrode and the first gate electrode is configured to form a first parasitic capacitance, and the first drain electrode is configured so that the first parasitic capacitance remains substantially constant even if a position of the first drain electrode relative to the first gate electrode shifts in the first direction as a result of manufacturing misalignment.

A width of the first end portion in the first direction is entirely encompassed within a width of the first gate electrode in the first direction so that a size of an overlap area between the first end portion of the first drain electrode and the first gate electrode remains substantially constant regardless of a position of the first drain electrode relative to the first gate electrode in the first direction.

The first drain electrode has a U-type shape and may further include a third portion connecting the first end portion and the second end portion.

The second end portion extends in the second direction parallel with the first end portion, the first data line, and the second data line, and the third portion of the first drain electrode extends in the first direction parallel with the second gate line.

The gate lines include a third gate line, wherein the display device further comprises a second pixel having a second thin-film transistor and a second pixel electrode, and defined by the second gate line, the third gate line, the first data line, and the second data line, and wherein the second thin-film transistor comprises: a second gate electrode connected to the third gate line; a second source electrode connected to the second data line; and a second drain electrode spaced apart from the second source electrode, the second drain electrode including a first end portion extending in the second direction and overlapping with the second gate electrode, and a second end portion electrically connected to the first end portion of the second drain electrode and to the second pixel electrode.

The shape of the second drain electrode is a mirror image of the shape of the first drain electrode.

The overlap area between the first end portion of the second drain electrode and the second gate electrode is configured to form a second parasitic capacitance, and the second drain electrode is configured so that the second parasitic capacitance remains substantially constant even if a position of the second drain electrode relative to the second gate electrode shifts in the first direction.

The first parasitic capacitance is substantially equal to the second parasitic capacitance, and the first parasitic capacitance remains substantially equal to the second parasitic capacitance even if a position of a conductive pattern including the first drain electrode and the second drain electrode shifts in the first direction relative to another conductive pattern including the first gate electrode and the second gate electrode.

The first drain electrode and the second drain electrode are configured so that a size of an overlap area between the first end portion of the first drain electrode and the first gate electrode or a size of an overlap area between the first end portion of the second drain electrode and the second gate electrode remains substantially constant even if a position of a first conductive pattern including the first drain electrode and the second drain electrode shifts in the first direction relative to a second conductive pattern including the first gate electrode and the second gate electrode.

The first drain electrode and the second drain electrode are configured so that the size of the overlap area between the first end portion of the first drain electrode and the first gate electrode is substantially equal to and remains substantially equal to the size of the overlap area between the first end portion of the second drain electrode and the second gate electrode even if the position of the first conductive pattern shifts in the first direction relative to the second conductive pattern.

The first thin-film transistor further comprises a first channel region overlapping with the first gate electrode and disposed adjacent to the first data line, and the second thin-film transistor further comprises a second channel region overlapping with the second gate electrode and disposed adjacent to the second data line.

The second end portion of the first drain electrode has a larger width in the first direction than the first end portion.

In another aspect, a display device, comprises: a substrate having a display area; a plurality of gate lines extending in a first direction in the display area, the gate lines including a first gate line, a second gate line, and a third gate line; a plurality of data lines extending in the display area in a second direction intersecting the first direction, the data lines including a first data line and a second data line; a first pixel defined by the first gate line, the second gate line, the first data line, and the second data line, and including a first thin-film transistor connected to the first data line, the first thin-film transistor including a first gate electrode and a first drain electrode overlapping each other in terms of their planar configuration; and a second pixel defined by the second gate line, the third gate line, the first data line, and the second data line, and including a second thin-film transistor connected to the second data line, the second thin-film transistor including a second gate electrode and a second drain electrode overlapping each other, wherein a size of an overlap area between the first drain electrode and the first gate electrode is substantially the same as a size of an overlap area between the second drain electrode and the second gate electrode even if a position of at least one of the first and the second drain electrodes relative to at least one of the first and the second gate electrodes shifts in the first direction as a result of manufacturing misalignment.

The above display device according to another aspect may further incorporate one or more of the following additional features:

The first thin-film transistor further includes a first source electrode connected to the first data line and spaced apart from the first drain electrode, and the second thin-film transistor further includes a second source electrode connected to the second data line and spaced apart from the second drain electrode.

The first thin-film transistor further includes a first channel region overlapping with the first gate electrode and disposed adjacent to the first data line, and the second thin-film transistor further includes a second channel region overlapping with the second gate electrode and disposed adjacent to the second data line.

The size of the overlap area between the first drain electrode and the first gate electrode remains substantially constant even if a position of the first drain electrode relative to the first gate electrode shifts along the first direction.

The first drain electrode includes a first end portion extending in the second direction and overlapping with the first gate electrode, the first end portion having a width entirely encompassed within a width of the first gate electrode in the first direction so that the size of the overlap area between the first drain electrode and the first gate electrode in plan view is substantially constant regardless of a position of the first drain electrode relative to the first gate electrode in the first direction.

In yet another aspect, an apparatus comprises: a substrate having an array of pixels in rows and columns, each pixel including a drain electrode having a first extended portion extending in a column direction of the pixels, and a gate electrode extending in a row direction of the pixels, wherein an end of the first extended portion of the drain electrode and a portion of the gate electrode overlap with each other in terms of their planar configuration to form an overlap region, which is configured to accommodate for possible manufacturing misalignment between the drain electrode and the gate electrode in the row direction of the pixels, by having edges of the end of the first extended portion of the drain electrode being disposed within side edges of the gate electrode.

The above apparatus according to yet another aspect may further incorporate one or more of the following additional features:

Each pixel further includes a pixel electrode connected to the drain electrode, and the drain electrode further includes a second extended portion extending in the column direction and connected between the pixel electrode and the first extended portion.

The second extended portion is wider in the row direction than the first extended portion.

A size of the overlap region is configured to remain substantially constant even if the manufacturing misalignment occurs.

Each pixel further includes a channel region overlapping with the gate electrode, and pixels along at least one of the columns have channel regions arranged in a zigzag pattern.

The respective overlap regions of at least two adjacent pixels in the at least one of the columns are configured to have a substantially same size as each other even if the manufacturing misalignment occurs.

It is to be understood that both the foregoing general description and the following detailed description are exemplary and explanatory and are intended to provide further explanation of the invention as claimed.

BRIEF DESCRIPTION OF THE DRAWINGS

The accompany drawings, which are included to provide a further understanding of the invention and are incorporated in and constitute a part of this specification, illustrate embodiments of the invention and together with the description serve to explain the principles of the invention. In the drawings.

DETAILED DESCRIPTION OF EXAMPLE EMBODIMENTS

Figure 1:
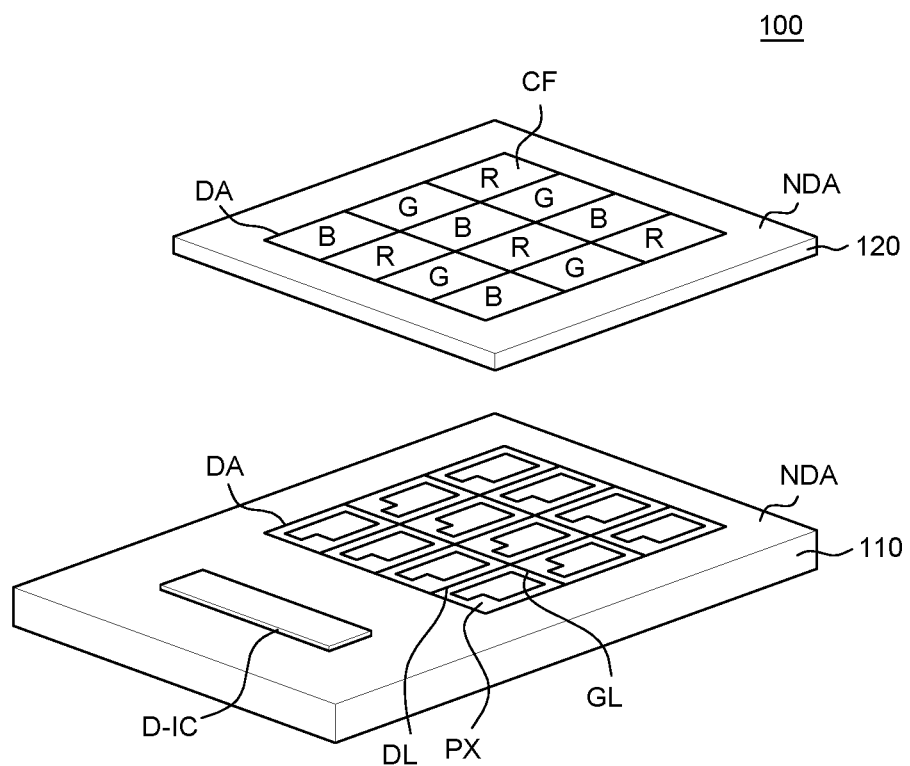
FIG. 1 is an exploded perspective view of an LCD device according to example embodiments of the present invention.

Reference will now be made in detail to embodiments of the invention, examples of which are illustrated in the accompanying drawings. Specific example embodiments of the present invention will be described in detail with reference to the attached drawings.

The figures, dimensions, ratios, angles, the numbers of elements given in the drawings are merely illustrative and are not limiting unless otherwise specified. Like reference numerals denote like elements throughout the descriptions. Further, descriptions on well-known features or technologies may be omitted so that the gist of the present disclosure is not unnecessarily obscured. Where such terms as "comprising," "having," and "including" are used in the description and claims, the terms should not be interpreted as being restricted to the features listed thereafter unless specifically stated otherwise. Where an article is used to refer to a singular noun, e.g., "a," "an," and "the," this encompasses a plural of that noun unless specifically stated otherwise.

Where dimensions, such as lengths, widths, thicknesses, areas, and volumes, measurements, ratios, directions, orientations, or angles are used in numerical or relative terms in describing elements, they are to be interpreted as encompassing error margins unless otherwise specified.

In describing positional relationship, such as "an element A on an element B," "an element A above an element B," "an element A below an element B," and "an element A next to an element B," another element C may be disposed between the elements A and B unless otherwise specified, e.g., with a use of a term like "directly" or "immediately." Thus, as used herein, the phrase "an element A on an element B" encompasses the element A being directly on the element B and the element A being on the element B with one or more elements C between the elements A and B.

Where the terms "first," "second," and the like are used in the descriptions and in the claims, they are used for distinguishing between similar elements and not necessarily for describing a sequential or chronological order, unless otherwise specified. These terms are used merely to distinguish one element from another similar element. Accordingly, as used herein, a "first" element may be considered a "second" element, and vice versa, within the technical idea of the present disclosure.

Like reference numerals denote like elements throughout the description unless otherwise specified.

Unless otherwise specified, the drawings are not to scale and the relative dimensions of various elements in the drawings are depicted schematically and not necessarily to scale.

Features of various example embodiments in the present disclosure may be combined partially or totally. As will be appreciated by those skilled in the art, technically various interactions and operations are possible. Various example embodiments can be practiced individually or in combination.

FIG. 1 is an exploded perspective view of an LCD device according to an example embodiment of the present invention. As shown in FIG. 1, an LCD device according to an example embodiment of the present invention may include a first substrate 110, a second substrate 120 and a liquid-crystal layer (now shown) between them.

Each of the first substrate 110 and the second substrate 120 may include a display area DA and a non-display area NDA. The display area DA is configured to display images. The non-display area NDA is not configured to display images.

The display area DA may be disposed in the center portion of the first substrate 110. In the display area DA of the first substrate 110, there may be disposed a plurality of gate lines GL extended in a first direction, a plurality of data lines DL extended in a second direction intersecting the first direction, and a plurality of pixels PX defined by their respective gate lines GL and data lines DL. The layout of elements of each pixel PX may differ depending on whether the pixel is disposed in an odd row or in an even row. This will be described in more detail below with reference to FIG. 2.

The non-display area NDA of the first substrate 110 may be disposed around an outer periphery of the display area DA of the first substrate 110. In the non-display area NDA of the first substrate 110, a drive integrated circuit D-IC for driving the gate lines GL and the data lines DL may be disposed.

In the display area DA of the second substrate 120, color filters CF may be disposed, one for each of the pixels PX. The color filters may include red (R), green (G), and blue (B) color filters arranged in an alternating manner.

In the non-display area NDA of the second substrate 120, a sealing element may be disposed to attach the second substrate 120 and the first substrate 110 together. The sealing element may also be disposed in the non-display area NDA of the first substrate 110 in addition to, or instead of, the non-display area NDA of the second substrate 120.

The liquid-crystal layer includes liquid-crystal molecules and is disposed between the first substrate 110 and the second substrate 120. The liquid-crystal molecules may be tilted by the electric field formed between the pixel electrode and the common electrode, which may be disposed in the display area DA of the first substrate 110 or the second substrate 120.

It is to be noted that the particular locations and shapes of the display area DA and the non-display area NDA of the first substrate 110 and the second substrate 120 are not limited to those described above but may be variously altered or selected.

Figure 2:
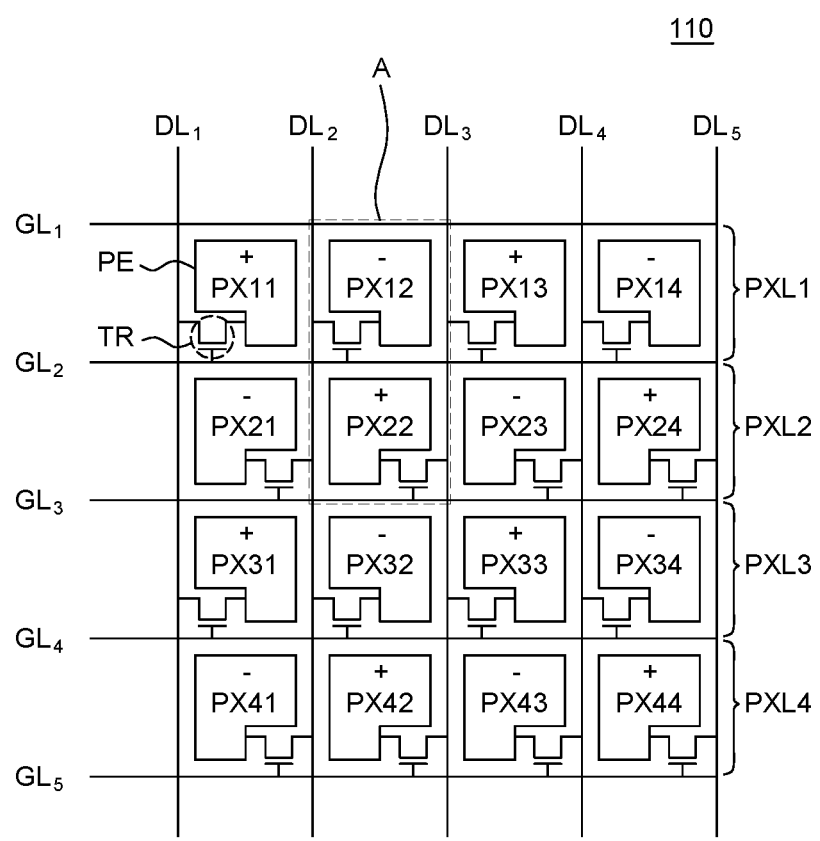
FIG. 2 is a schematic plan view for illustrating an LCD device according to example embodiments of the present invention.

FIG. 2 is a schematic plan view for illustrating an LCD device according to an example embodiment of the present invention. As shown in FIG. 2, a plurality of pixels may be disposed in pixel rows PXL1, PXL2, PXL3 and PXL4. The pixels may be defined by a plurality of gate lines GL1, GL2, GL3, GL4 and GL5 arranged in a first direction and a plurality of data lines DL1, DL2, DL3, DL4 and DL5 arranged in a second direction.

Each of the pixels PX may include a thin-film transistor TR configured to work as a switching element and a pixel electrode PE configured to receive data voltage via the thin-film transistor TR. The thin-film transistors TR each disposed in the respective pixels PX may be located on the right side and the left side of the respective data lines DL alternately. For example, a thin-film transistor TR of a second pixel PX12 of a first pixel row PXL1 may be disposed on the right side of a second data line DL2, whereas a thin-film transistor TR of a first pixel PX21 of a second pixel row PXL2 may be disposed on the left side of the second data line DL2. In other words, the thin-film transistors TR of the pixels PX in the odd pixel rows may be disposed on the other side of the respective data lines from the thin-film transistors TR of the pixels PX in the even pixel rows.

In addition, the polarity of data voltages applied to the respective pixels PX from the odd-numbered data lines DL may be opposite the polarity of data voltages applied to the respective pixels PX from the even-numbered data lines DL. For example, the pixels PX11, PX13, PX22, PX24, PX31, PX33, PX42 and PX44 may receive positive voltages from the data lines DL1, DL3 and DL5, respectively, whereas the pixels PX12, PX14, PX21, PX23, PX32, PX34, PX41 and PX43 may receive negative voltages from data lines DL2 and DL4, respectively. In addition, the data voltages applied to the pixels PX may be inverted in response to a POL signal.

As described above, in the LCD device 100 according to the example embodiment of the present invention, the location of the thin-film transistors TR in the respective pixels PX alternates with respect to the data lines DL, e.g., in a zigzag pattern. Also, as detailed above, data voltages of opposite polarities are applied to the pixels PX depending on the configuration of the data lines DL. Accordingly, it is possible to suppress the liquid-crystal layer from deteriorating and thus to improve the image quality. In addition, parasitic capacitance Cgd between adjacent pixels PX can be maintained constant or substantially constant with an improved pattern of a drain electrode of a thin-film transistor TR so as to improve the reliability of image quality. Hereinafter, an example configuration of drain electrodes will be described in detail with reference to FIG. 3.

Figure 3:
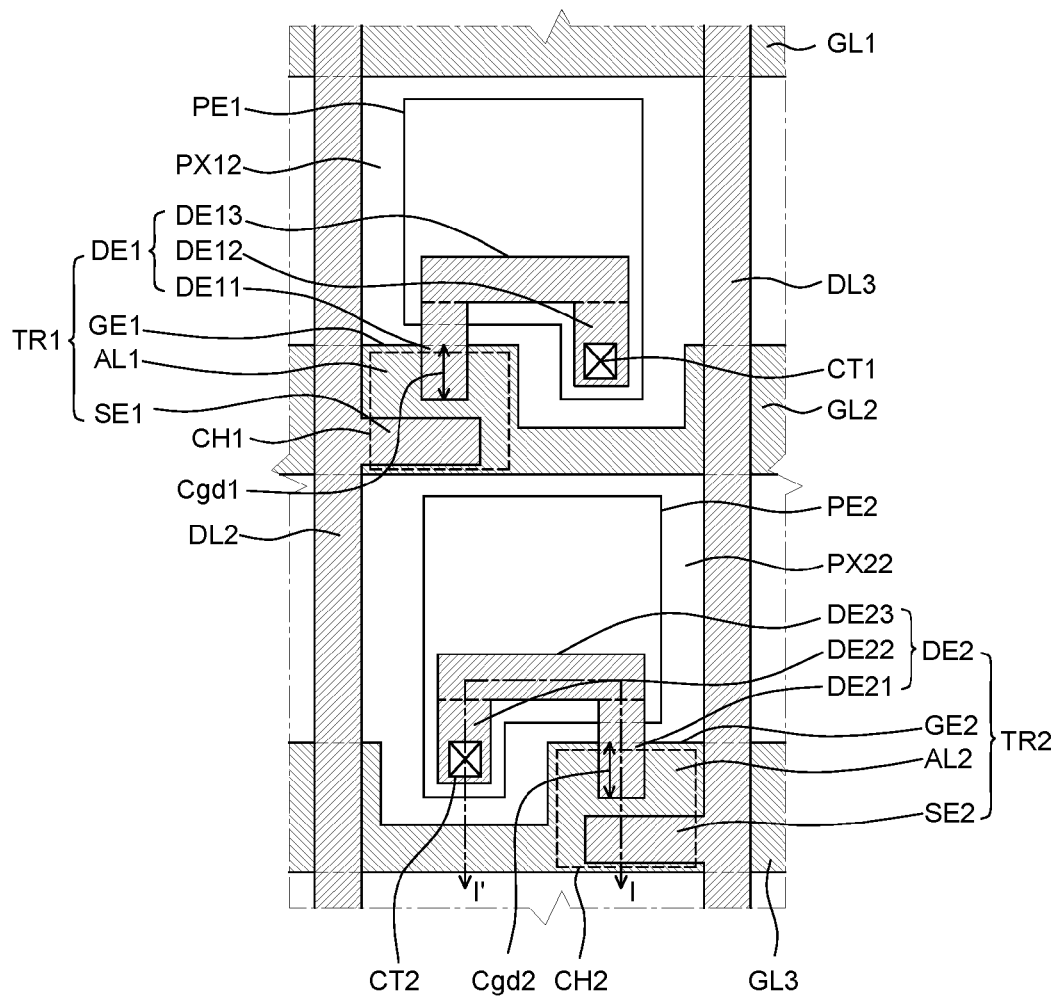
FIG. 3 is a schematic plan view for illustrating an LCD device according to a first example embodiment of the present invention.

FIG. 3 is a schematic plan view for illustrating an LCD device according to a first example embodiment of the present invention. FIG. 3 is an enlarged view of portion A of FIG. 2, in which some of the pixels in the display area DA of the first substrate 110 are disposed. For convenience of illustration, the second pixel PX12 of the first pixel row PXL1 in portion A of FIG. 2 is referred to as an upper pixel in the description with reference to FIG. 3, and the second pixel PX22 of the second pixel row PXL2 in portion A of FIG. 2 is referred to as a lower pixel in the description with reference to FIG. 3.

As illustrated in FIG. 3, the upper pixel PX12 is configured to receive a data voltage from the second data line DL2, and the lower pixel PX22 is configured to receive data voltage from the third data line DL3.

The upper pixel PX12 may include a first thin-film transistor TR1 on the left side of the upper pixel PX12 adjacent to the second data line DL2. The upper pixel PX12 may also include a first pixel electrode PE1 to the right of the first thin-film transistor TR1.

The first thin-film transistor TR1 includes a first gate electrode GE1 extended from the second gate line GL2, a first source electrode SE1 protruding from the second data line DL2, and a first drain electrode DE1 spaced apart from the first source electrode SE1. One end of the first drain electrode DE1 overlaps the first gate electrode GE1, and the other end of the first drain electrode DE1 is electrically connected to the first pixel electrode PE1. As described above, since one end of the first drain electrode DE1 overlaps the first gate electrode GE1 and the other end of the first drain electrode DE1 is electrically connected to the first pixel electrode PE1, the first drain electrode DE1 has a bent shape. More specifically, the first drain electrode DE1 is divided into sub-drain electrodes. Hereinafter, the end of the first drain electrode DE1 overlapping the first gate electrode GE1 is referred to as a first sub-drain electrode DE11, and the other end of the first drain electrode DE1 electrically connected to the first pixel electrode PE1 is referred to as a second sub-drain electrode DE12.

The first sub-drain electrode DE11 overlaps the first gate electrode GE11 to form a first parasitic capacitance region Cgd1. The first sub-drain electrode DE11 may have a straight line shape extended in parallel with the second data line DL2 and the third data line DL3. In addition, as shown for example in FIG. 3, the first sub-drain electrode DE11 is not extended beyond the periphery of the first gate electrode GE1 in the direction parallel to the second gate line GL2. In other words, the right peripheral side of the first sub-drain electrode DE11 may be disposed at or to the left of the right peripheral side of the first gate electrode GE11. Accordingly, as the width of the first sub-drain electrode DE11 is smaller than the width of the first gate electrode GE1, and the first sub-drain electrode DE11 has a straight line shape extending in parallel with the second data line DL2 and the third data line DL3, the size of the area where the first drain electrode DE1 overlaps the first gate electrode GE1 in plan view may be maintained constant or substantially constant even if there is a manufacturing process error, i.e., the drain electrode or the gate electrode is shifted along the x-axis or in the direction parallel to the gate lines GL. As a result, the first parasitic capacitance Cgd1 is maintained constant or substantially constant. Further, according to some of the example embodiments of the present invention, a compensation pattern may be further provided to compensate for deviation in parasitic capacitance in the event that the drain electrode or the gate electrode is shifted along the x-axis by more than a certain distance due to a manufacturing process error.

In addition, a first active layer AL1 may be disposed under the first sub-drain electrode DE11 and the first source electrode SE1. The first sub-drain electrode DE11 is spaced apart from the first source electrode SE1, and a first channel region CH1 is formed between the first sub-drain electrode DE11 and the first source electrode SE1. In the upper pixel PX12, the first channel region CH1 is formed closer to the second data line DL2 than to the third data line DL3.

The second sub-drain electrode DE12, on the other hand, is electrically connected to the first pixel electrode PE1 in a region referred to as a first contact area CT1. The second sub-drain electrode DE12, like the first sub-drain electrode DE11, may have a straight line shape extended in parallel with the second data line DL2 and the third data line DL3. Although the second sub-drain electrode DE12 is shown as being extended in parallel with the first sub-drain electrode DE11 in FIG. 3, this is merely an illustrative example as the second sub-drain electrode DE12 may extend in a direction not parallel to the first sub-drain electrode DE11.

The width of the second sub-drain electrode DE12 may be different from the width of the first sub-drain electrode DE11. For example, the width of the second sub-drain electrode DE12 may be larger than the width of the first sub-drain electrode DE11. The first sub-drain electrode DE11 may have a small width to reduce parasitic capacitance Cgd and to reduce deviation in parasitic capacitance between the upper pixel PX12 and the lower pixel PX22 even if there is a manufacturing process error. On the other hand, the second sub-drain electrode DE12 may have a larger width to provide a larger region where it can be electrically connected to the first pixel electrode PE1. However, this is merely an illustrative example, and the width of the second sub-drain electrode DE12 may be equal to or smaller than the width of the first sub-drain electrode DE11.

In the upper pixel PX12, the first pixel electrode PE1 may be disposed so as not to overlap the first gate electrode GE1. Accordingly, the first parasitic capacitance region Cgd1 is spaced apart from the first contact area CT1, as shown for example in FIG. 3. Accordingly, the first drain electrode DE1 may further include a third sub-drain electrode DE13 for electrically connecting the first sub-drain electrode DE11 to the second sub-drain electrode DE12. That is, the first drain electrode DE1 may have a U-shape consisting of the first sub-drain electrode DE11, the second sub-drain electrode DE12, and the third sub-drain electrode DE13. However, the shape of the first drain electrode DE1 is not limited to the U-shape shown in FIG. 3. For example, the first sub-drain electrode DE11 may be directly connected to the second sub-drain electrode DE12 without the third sub-drain electrode DE13. In this case, the first drain electrode DE1 may have a V-shape.

The lower pixel PX22 may include a second thin-film transistor TR2 on the right side of the lower pixel PX22 adjacent to the third data line DL3. The lower pixel PX22 may also include a second pixel electrode PE2 to the left of the second thin-film transistor TR2.

The second thin-film transistor TR2 includes a second gate electrode GE2 extended from the third gate line GL3, a second source electrode SE2 protruding from the third data line DL3, and a second drain electrode DE2 spaced apart from the second source electrode SE2. One end of the second drain electrode DE2 overlaps the second gate electrode GE2, and the other end of the second drain electrode DE2 is electrically connected to the second pixel electrode PE2. As described above, since one end of the second drain electrode DE2 overlaps the second gate electrode GE2 and the other end of the second drain electrode DE2 is electrically connected to the second pixel electrode PE2, the second drain electrode DE2 has a bent shape. The second drain electrode DE2 is substantially identical in shape to the first drain electrode DE1. Therefore, the above detailed description is not repeated with respect to the shape of the second drain electrode DE2, as well as for the sub-drain electrodes DE21, DE22, and DE23 of the second drain electrode DE2.

The second thin-film transistor TR2 includes a second parasitic capacitance region Cgd2 and a second contact area CT2. In addition, a second channel region CH2 overlaps the second parasitic capacitance region Cgd2. The second channel region CH2 of the second thin-film transistor TR2 and the first channel region CH1 of the first thin-film transistor TR1 are disposed in a zigzag pattern. In other words, the first parasitic capacitance region Cgd1 is disposed in its corresponding pixel at a side (e.g., at the left side of the upper pixel PX12) opposite the side at which the second parasitic capacitance region Cgd2 is disposed in its corresponding pixel (e.g., at the right side of the lower pixel PX22).

The size of the first parasitic capacitance region Cgd1 of the upper pixel PX12 can be maintained substantially equal to the size of the second parasitic capacitance region Cgd2 of the lower pixel PX22 in plan view even in the event of a manufacturing process error, for example, along the x-axis or y-axis. This can be achieved at least partly because the end of the first drain electrode DE1 overlapping the first gate electrode GE1 and the end of the second drain electrode DE2 overlapping the second gate electrode GE2 are disposed parallel or substantially parallel to either other, for example, in a straight line along the direction parallel to the second data line DL2 and the third data line DL3. Accordingly, although the first parasitic capacitance region Cgd1 of the upper pixel PX12 and the second parasitic capacitance region Cgd2 of the lower pixel PX22 are disposed at opposite sides of each other, the deviation in size of the parasitic capacitance area between the pixels can be prevented or reduced even if a pattern including the drain electrodes is shifted, for example, in relation to a pattern including the gate electrodes, due to a manufacturing process error. Accordingly, the LCD device 100 according to an example embodiment of the present invention can prevent or reduce deviation in parasitic capacitance among all of the pixels. Accordingly, defects caused by the deviation in the parasitic capacitance among the pixels can be suppressed.

The potential effects achieved by the LCD device 100 according to example embodiments of the present invention will be described in detail with reference to FIGS. 4A, 4B, 5A, 5B, 6A, and 6B.

Figure 4A:
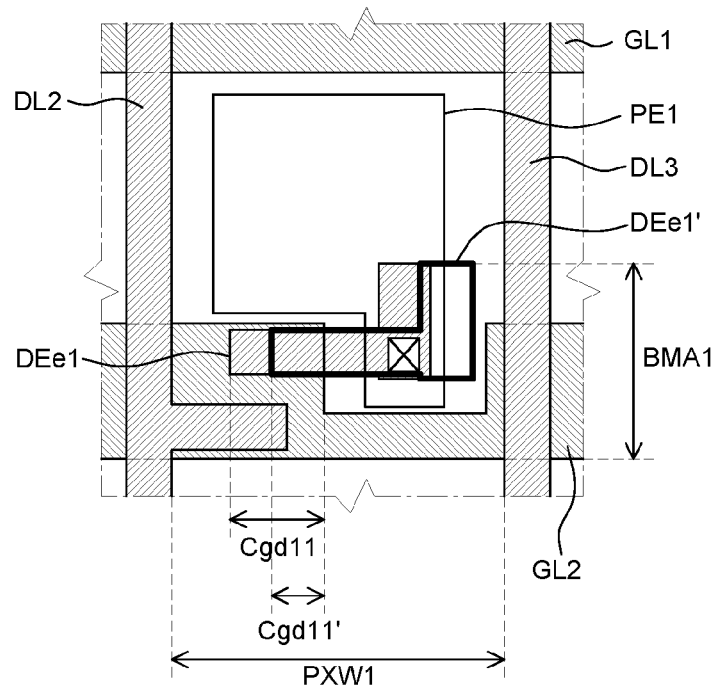
FIGS. 4A, 4B, 5A, 5B, 6A, and 6B are plan views for illustrating effects achieved by the LCD device according to example embodiments of the present invention.
Figure 4B:
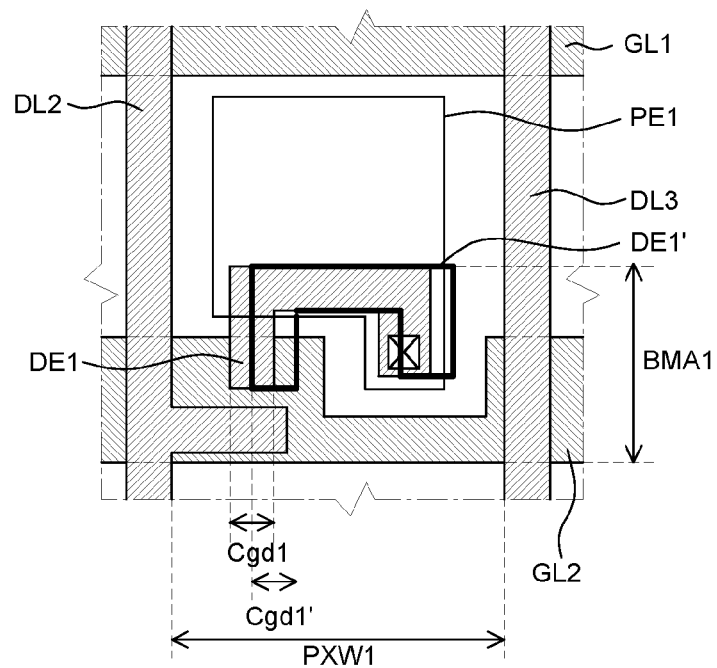

FIGS. 4A, 4B, 5A, 5B, 6A, and 6B are plan views for illustrating effects achieved by the LCD device according to the example embodiment of the present invention in comparison with test examples. FIG. 4A shows a comparative example in which a drain electrode having a pattern to improve the aperture ratio is employed, and FIG. 4B shows the drain electrode having a pattern according to the example embodiment of the present invention.

As shown in FIG. 4A, a drain electrode DEe1 has an "L" shape with a horizontal-straight-line component in parallel with the second gate line GL2. In this case, there is a potential advantage in that the black matrix area BMA1 can be reduced such that a high aperture ratio can be obtained. However, in the event of a manufacturing process error along the x-axis such that the drain electrode DEe1 is shifted along the x-axis (e.g., to a position illustrated as DEe1 '), the magnitude of parasitic capacitance may be significantly changed (e.g., from Cgd11 to Cgd11'). Namely, the parasitic capacitance Cgd11 may become significantly smaller if the drain electrode DEe1 is shifted erroneously, i.e., the parasitic capacitance Cgd11' may be smaller than the parasitic capacitance Cgd11.

In contrast, as shown in FIG. 4B, the drain electrode DE1 according to an example embodiment of the present invention allows for the parasitic capacitance Cgd to be maintained constant or substantially constant even in the event that the pattern of the drain electrode DE1 is shifted, e.g., in relation to the pattern of the gate electrode, due to a process error along the x-axis.

Figure 5A:
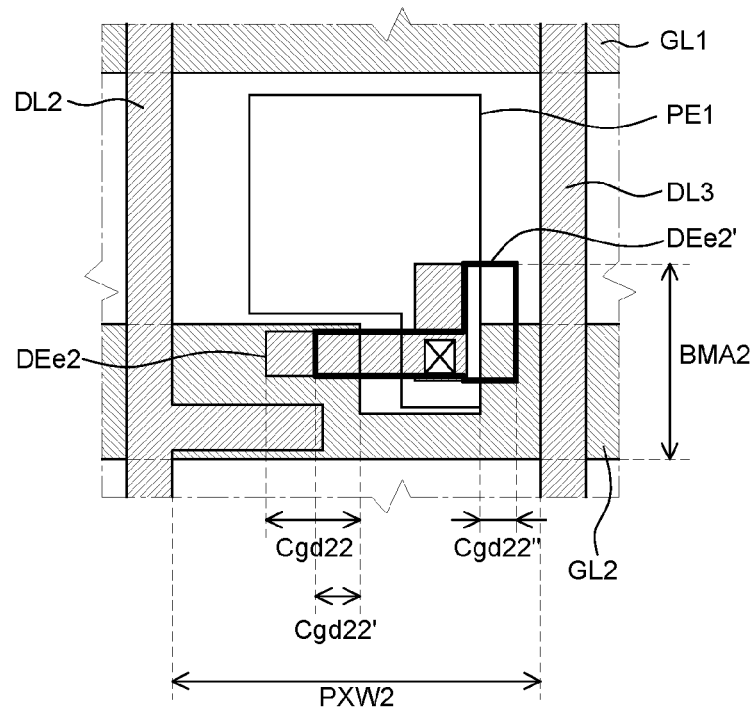
Figure 5B:
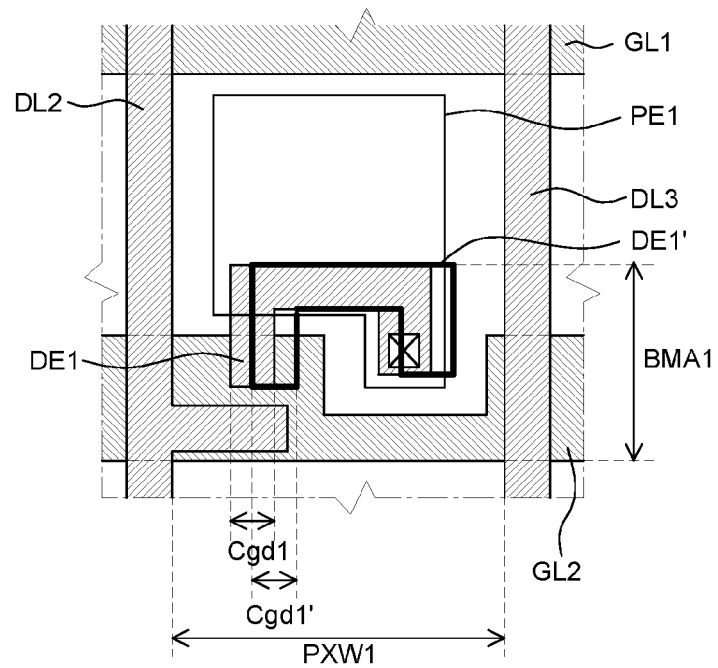

Next, FIG. 5A depicts a comparative example in which a pattern for compensating for parasitic capacitance is added to suppress deviation in parasitic capacitance Cgd22 between the pixels due to the drain electrode DEe2 being shifted (e.g., to a position illustrated as DEe2'), thereby overcoming a shortcoming of the example shown in FIG. 4A. In other words, according to the example shown in FIG. 5A, the compensating pattern allows the parasitic capacitance to remain constant, i.e., the parasitic capacitance Cgd22 is equal to the combined parasitic capacitance Cgd22'+Cgd22", even if the drain electrode DEe2 is erroneously shifted. Thus, by adding the pattern for compensating for the parasitic capacitance, the deviation in parasitic capacitance between the pixels can be reduced. However, the addition of the compensating pattern increases the width of the pixel. For example, the width PXW2 of the pixel PX in the example shown in FIG. 5A is larger than the width PXW1 of the pixel PX in the example embodiment of the present invention shown in FIG. 5B. Accordingly, although the example shown in FIG. 5A can reduce the deviation in parasitic capacitance between the pixels, the width of the pixels becomes larger. Therefore, the example shown in FIG. 5A is less suitable for high integration and high resolution LCD devices.

Figure 6A:
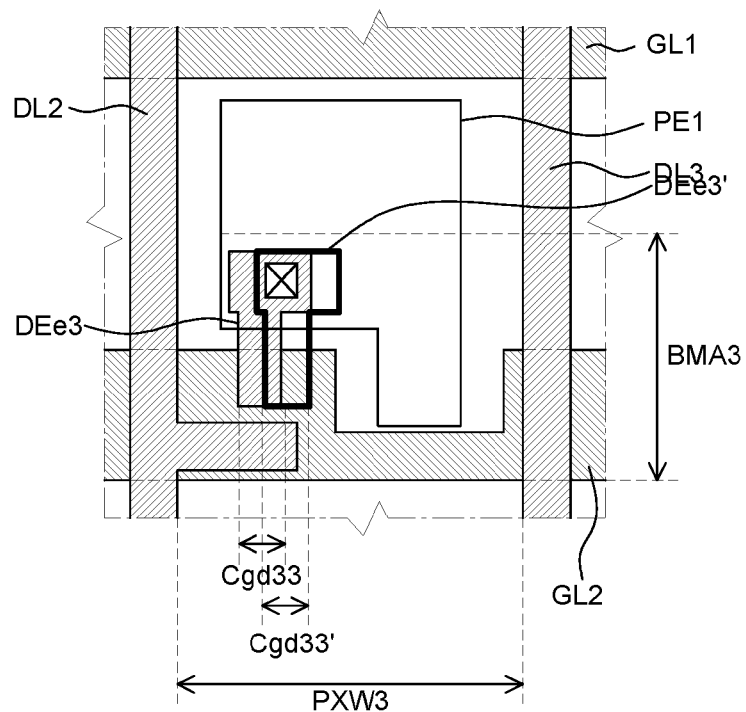

In another example embodiment shown in FIG. 6A, a drain electrode DEe3 has a primarily vertical-straight-line shape parallel to the second data line DL2 and the third data line DL3. The drain electrode DEe3 having the pattern shown in FIG. 6A can reduce the deviation in parasitic capacitance Cgd between the pixels and can also be applied to high integration and high resolution LCD devices. However, since the drain electrode DEe3 shown in FIG. 6A is disposed in the vertical-straight-line shape, a contact hole for electrically connecting the drain electrode DEe3 to the pixel electrode PE1 is placed at an end of the vertical-straight-line shaped drain electrode, resulting in an increased overall height of the drain electrode compared to the first example embodiment. Accordingly, the size of the black matrix area BMA3 in plan view may become larger such that the aperture ratio may be reduced.

Figure 6B:
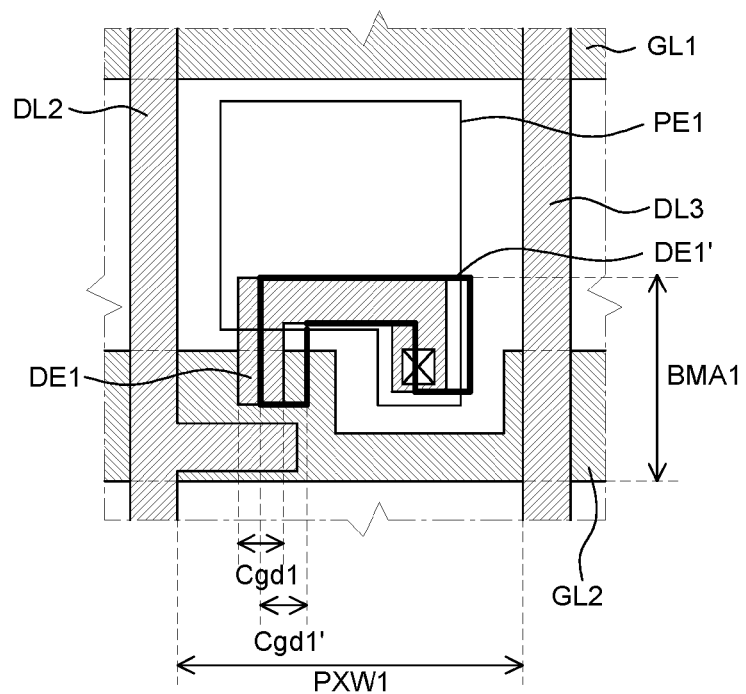

In contrast, as shown in FIG. 6B, in the LCD device according to the first example embodiment of the present invention, the drain electrode DE1 includes a straight line shape in parallel with the data lines DL in the area where the parasitic capacitance Cgd is formed while being bent toward the contact area in which it is connected to the pixel electrode. Accordingly, the drain electrode pattern according to the example embodiment is capable of reducing the deviation in parasitic capacitance between the pixels even in the event of a manufacturing process error while also providing for a sufficient aperture ratio without increasing the black matrix area BMA1.

The example embodiments of the present invention may have one or more of the features discussed above in the SUMMARY section.

It will be apparent to those skilled in the art that various modifications and variations can be made in the liquid crystal display device of the present invention without departing from the spirit or scope of the invention. Thus, it is intended that the present invention cover the modifications and variations of this invention provided they come within the scope of the appended claims and their equivalents.

What is claimed is:
1. A display device, comprising:
a substrate having a display area;
a plurality of gate lines extending in a first direction in the display area, the gate lines including a first gate line and a second gate line;
a plurality of data lines extending in the display area in a second direction intersecting the first direction, the data lines including a first data line and a second data line; and
a first pixel having a first thin-film transistor and a first pixel electrode, and defined by the first gate line, the second gate line, the first data line, and the second data line,
wherein the first thin-film transistor comprises:
a first gate electrode connected to the second gate line;
a first source electrode connected to the first data line; and
a first drain electrode spaced apart from the first source electrode, the first drain electrode including:

a first end portion extending in the second direction and overlapping with the first gate electrode in terms of their planar configuration; and a second end portion electrically connected to the first end portion and to the first pixel electrode, and wherein a width of the first end portion in the first direction is entirely encompassed within a width of the first gate electrode in the first direction so that a size of an overlap area between the first end portion of the first drain electrode and the first gate electrode remains substantially constant regardless of a position of the first drain electrode relative to the first gate electrode in the first direction.

2. The display device of claim 1, wherein an overlap area between the first end portion of the first drain electrode and the first gate electrode is configured to form a first parasitic capacitance, and wherein the first drain electrode is configured so that the first parasitic capacitance remains substantially constant even if a position of the first drain electrode relative to the first gate electrode shifts in the first direction as a result of manufacturing misalignment.

3. The display device of claim 1, wherein the first drain electrode has a U-type shape and further includes a third portion connecting the first end portion and the second end portion.

4. The display device of claim 3, wherein the second end portion extends in the second direction parallel with the first end portion, the first data line, and the second data line, and wherein the third portion of the first drain electrode extends in the first direction parallel with the second gate line.

5. The display device of claim 1, wherein the gate lines include a third gate line, wherein the display device further comprises a second pixel having a second thin-film transistor and a second pixel electrode, and defined by the second gate, the third gate the first data line, and the second data line, and wherein the second thin-film transistor comprises:
a second gate electrode connected to the third gate line;
a second source electrode connected to the second data line; and
a second drain electrode spaced apart from the second source electrode, the second drain electrode including:
a first end portion extending in the second direction and overlapping with the second gate electrode, and
a second end portion electrically connected to the first end portion of the second drain electrode and to the second pixel electrode.

6. The display device of claim 5, wherein the shape of the second drain electrode is a mirror image of the shape of the first drain electrode.

7. The display device of claim 5, wherein an overlap area between the first end portion of the second drain electrode and the second gate electrode is configured to form a second parasitic capacitance, and wherein the second drain electrode is configured so that the second parasitic capacitance remains substantially constant even if a position of the second drain electrode relative to the second gate electrode shifts in the first direction.

8. The display device of claim 7, wherein the first parasitic capacitance is substantially equal to the second parasitic capacitance, and wherein the first parasitic capacitance remains substantially equal to the second parasitic capacitance even if a position of a conductive pattern including the first drain electrode and the second drain electrode shifts in the first direction relative to another conductive pattern including the first gate electrode and the second gate electrode.

9. The display device of claim 5, wherein the first drain electrode and the second drain electrode are configured so that a size of an overlap area between the first end portion of the first drain electrode and the first gate electrode or a size of an overlap area between the first end portion of the second drain electrode and the second gate electrode remains substantially constant even if a position of a first conductive pattern including the first drain electrode and the second drain electrode shifts in the first direction relative to a second conductive pattern including the first gate electrode and the second gate electrode.

10. The display device of claim 9, wherein the first drain electrode and the second drain electrode are configured so that:
the size of the overlap area between the first end portion of the first drain electrode and the first gate electrode is substantially equal to and remains substantially equal to the size of the overlap area between the first end portion of the second drain electrode and the second gate electrode even if the position of the first conductive pattern shifts in the first direction relative to the second conductive pattern.

11. The display device of claim 5, wherein the first thin-film transistor further comprises a first channel region overlapping with the first gate electrode and disposed adjacent to the first data line, and wherein the second thin-film transistor further comprises a second channel region overlapping with the second gate electrode and disposed adjacent to the second data line.

12. The display device of claim 1, wherein the second end portion has a larger width in the first direction than the first end portion.

13. A display device, comprising:
a substrate having a display area;
a plurality of gate lines extending in a first direction in the display area, the gate lines including a first gate line, a second gate line, and a third gate line;
a plurality of data lines extending in the display area in a second direction intersecting the first direction, the data lines including a first data line and a second data line;
a first pixel defined by the first gate line, the second gate line, the first data line, and the second data line, and including a first thin-film transistor connected to the first data line, the first thin-film transistor including a first gate electrode and a first drain electrode overlapping each other in terms of their planar configuration; and
a second pixel defined by the second gate line, the third gate line, the first data line, and the second data line, and including a second thin-film transistor connected to the second data line, the second thin-film transistor including a second gate electrode and a second drain electrode overlapping each other,
wherein a size of an overlap area between the first drain electrode and the first gate electrode is substantially the same as a size of an overlap area between the second drain electrode and the second gate electrode even if a position of at least one of the first and the second drain electrodes relative to at least one of the first and the second gate electrodes shifts in the first direction as a result of manufacturing misalignment.

14. The display device of claim 13, wherein the first thin-film transistor further includes a first source electrode connected to the first data line and spaced apart from the first drain electrode, and
wherein the second thin-film transistor further includes a second source electrode connected to the second data line and spaced apart from the second drain electrode.

15. The display device of claim 13, wherein the first thin-film transistor further includes a first channel region overlapping with the first gate electrode and disposed adjacent to the first data line, and
wherein the second thin-film transistor further includes a second channel region overlapping with the second gate electrode and disposed adjacent to the second data line.

16. The display device of claim 13, wherein the size of the overlap area between the first drain electrode and the first gate electrode remains substantially constant even if a position of the first drain electrode relative to the first gate electrode shifts along the first direction.

17. The display device of claim 13, wherein the first drain electrode includes:
a first end portion extending in the second direction and overlapping with the first gate electrode, the first end portion having a width entirely encompassed within a width of the first gate electrode in the first direction so that the size of the overlap area between the first drain electrode and the first gate electrode is substantially constant regardless of a position of the fir drain electrode relative to the first gate electrode in the first direction.

18. An apparatus, comprising:
a substrate having an array of pixels in rows and columns, each pixel including
a drain electrode having a first extended portion extending in a column direction of the pixels; and
a gate electrode extending in a row direction of the pixels,
wherein an end of the first extended portion of the drain electrode and a portion of the gate electrode overlap with each other in terms of their planar configuration to form an overlap region, which is configured to accommodate for possible manufacturing misalignment between the drain electrode and the gate electrode in the row direction of the pixels, by having edges of the end of the first extended portion of the drain electrode being disposed within side edges of the gate electrode.

19. The apparatus of claim 18, wherein each pixel further includes a pixel electrode connected to the drain electrode, and
wherein the drain electrode further includes a second extended portion extending in the column direction and connected between the pixel electrode and the first extended portion.

20. The apparatus of claim 19, wherein the second extended portion is wider in the row direction than the first extended portion.

21. The apparatus of claim 18, wherein a size of the overlap region is configured to remain substantially constant even if the manufacturing misalignment occurs.

22. The apparatus of claim 18, wherein each pixel further includes a channel region overlapping with the gate electrode, and
wherein pixels along at least one of the columns have channel regions arranged in a zig zag pattern.

23. The apparatus of claim 22, wherein the respective overlap regions of at least two adjacent pixels in the at least one of the columns are configured to have a substantially same size as each other even if the manufacturing misalignment occurs.

* * * * *